United States Patent
Schmid et al.

(10) Patent No.: US 11,635,457 B2
(45) Date of Patent: Apr. 25, 2023

(54) APPARATUS AND METHOD FOR PERFORMING TIME DOMAIN REFLECTORMETRY

(71) Applicant: Rohde & Schwarz GmbH & Co. KG, Munich (DE)

(72) Inventors: Julian Schmid, Erkheim (DE); Reiner Hausdorf, Kirchheim (DE); Josef Breher, Bad Grönenbach (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 330 days.

(21) Appl. No.: 16/994,797

(22) Filed: Aug. 17, 2020

(65) Prior Publication Data

US 2022/0050011 A1    Feb. 17, 2022

(51) Int. Cl.
| | |
|---|---|
| *G01R 31/11* | (2006.01) |
| *G01M 11/00* | (2006.01) |
| *G01R 31/28* | (2006.01) |

(52) U.S. Cl.
CPC ......... *G01R 31/11* (2013.01); *G01M 11/3109* (2013.01); *G01M 11/3172* (2013.01); *G01R 31/2822* (2013.01)

(58) Field of Classification Search
CPC ............... G01R 31/11; G01R 31/2822; G01M 11/3109; G01M 11/3172
See application file for complete search history.

(56) References Cited

U.S. PATENT DOCUMENTS

| | | | |
|---|---|---|---|
| 7,113,879 B2 | 9/2006 | Hillstrom | |
| 7,170,297 B1 * | 1/2007 | Dunsmore | G01R 27/28 702/109 |
| 2010/0188095 A1 * | 7/2010 | Maslen | G01R 31/11 324/533 |
| 2014/0176156 A1 * | 6/2014 | Pupalaikis | G01R 35/005 324/601 |
| 2014/0343883 A1 * | 11/2014 | Libby | G01R 13/02 702/68 |
| 2018/0184081 A1 * | 6/2018 | Harris | H04N 17/00 |
| 2019/0107573 A1 * | 4/2019 | Ben Hassen | G01R 31/11 |

* cited by examiner

*Primary Examiner* — Amy He
(74) *Attorney, Agent, or Firm* — Westman, Champlin & Koehler, P.A.

(57) ABSTRACT

A time domain reflectometry measurement apparatus and method is provided. Measurement data of a time domain reflectometry measurement are analyzed with respect to previously acquired empirical measurement data of error-free or faulty devices with known failures. In this way, failures can be identified in the device under test without the need of opening the device.

20 Claims, 4 Drawing Sheets

APPARATUS AND METHOD FOR PERFORMING TIME DOMAIN REFLECTORMETRY

TECHNICAL FIELD

The present invention relates to an apparatus for performing time domain reflectometry. The present invention further relates to a method for performing time domain reflectometry.

BACKGROUND

Even though applicable in principle to any kind of electronic device with an input terminal for receiving signals, the present invention and its underlying problem will be hereinafter described in connection with testing a device with a radio frequency front end.

Error analysis of a defective device often requires to open the respective device. After opening the device, an optical examination of defect components may be performed or the device may be examined by specific measurements.

However, especially in the environment of radio frequency devices, e.g. devices with a radio frequency front end, such an examination of defect components may be difficult and require clean room environment, high performance microscopes, ultraviolet light or further complex requirements. Furthermore, radio frequency devices may require extensive shielding, and thus, opening such devices is a complex and time-consuming process.

In view of this, there is a need for an easy and reliable process of identifying failures in an electronic device, in particular an electronic device with radio frequency components such as a radio frequency front end. Further, there is a need for a simple and fast error analysis of RF devices.

Against this background, the present invention aims to provide an apparatus and a method for analyzing a device under test. In particular, the present invention aims to provide an easy and fast error analysis of electronic devices. Especially, the present invention provides an apparatus and a method for analyzing a device under test by performing time domain reflectometry.

SUMMARY

The present invention provides an apparatus and a method for performing time domain reflectometry with the features of the independent claims. Further advantageous embodiments are subject-matter of the dependent claims.

According to a first aspect, an apparatus for performing time domain reflectometry is provided. The apparatus comprises a measurement device, an analysis memory and a control device. The measurement device is configured to execute a time domain reflectometry measurement. The time domain reflectometry measurement may be performed on a device under test. The measurement device comprises a measurement terminal, which is connected to the device under test by a conductive radio frequency connection, e.g. a cable or the like. The device under test may be configured to receive radio frequency signals. The analysis memory is configured to provide a number of device patterns of the device under test. The control device comprises a processing unit, a data interface and a measurement interface. The processing unit is configured to obtain a measurement profile of the device under test. The measurement profile may comprise a specification of components included in the device under test. The data interface is configured to obtain the device patterns from the analysis memory. In particular, the data interface may obtain device patterns relating to components of the device under test according to the obtained measurement profile. The measurement interface is configured to receive a measurement result of the time domain reflectometry measurement from the measurement device. The processing unit is further configured to identify failure of the device under test. In particular, the failure of the device under test may be identified by comparing the obtained measurement result with the received device patterns.

According to a further aspect, a method for performing a time domain reflectometry is provided. The method comprises obtaining a measurement profile of the device under test. The measurement profile may comprise a specification of components included in the device under test. The method further comprises executing time domain reflectometry measurement on the device under test. The time domain reflectometry measurement may be performed by a measurement device. In particular, the measurement device may comprise a measurement terminal, which is connected to the device under test by a conductive radio frequency connection. The device under test may be configured to receive radio frequency signals. The method further comprises a step of receiving device patterns. The device patterns may be received from an analysis memory. The device patterns may relate to components of the device under test according to the obtained measurement profile. Finally, the method comprises a step of identifying a failure of the device under test. The failure of the device under test may be identified by comparing a measurement result of the time domain reflectometry measurement with the received device patterns.

The present invention is based on the finding that an analysis of defect components, in particular an analysis of defect radio frequency components such as a RF front end could be a complex and time consuming task. The present invention is further based on the finding that failures in an electronic component, in particular faulty positions may cause an interfering point in a propagation path of a signal. Accordingly, such an interfering point of a faulty position may be detected by a time domain reflectometry measurement.

Based on this finding, the present invention aims to provide an easy and reliable analysis of a defect electronic device by identifying faulty positions in the device based on time domain reflectometry measurements. In this way, it is possible to identify erroneous elements or conductive lines without a need of opening the respective device. Accordingly, the effort and the time for analyzing a defect device and identifying a failure can be reduced. Thus, service time of a defect device can be minimized, and the service costs are reduced.

For further analysis of the device under test and for identifying failures of a device under test in more detail, it is not only determined whether or not a faulty position exists within the device under test. In case the time domain reflectometry measurement identifies a faulty position, the measurement data of the time domain reflectometry is used in order to identify a position of a failure and the related element of the failure. For this purpose, additional information is taken into account. The additional information relates to information specifying the components of the device under test. The information for specifying the device under test in more detail may be provided, for example, by a measurement profile. The measurement profile may comprise, for example, information of the individual elements of the device under test. For example, the information may specify components such as capacitors, inductors, resistors, mixers, couplers, splitters, oscillators, attenuators, amplifiers or any other kind of active or passive components. Further to these components, the measurement profile may also comprise information relating to connections between the individual elements. For this purpose, any kind of signal lines such as wires, cables, waveguides, lines on a printed circuit board or the like may be specified. In particular, it may be also possible to specify further information, for example information of the material of the respective components. Accordingly, a propagation speed of a signal through the respective signal lines for elements may be derived based on this information. However, it may be also possible to directly provide information about the propagation speed of a signal through the respective components. Furthermore, it may be also possible to specify, for example, a length of the respective elements or signal lines. In this way, the propagation of a signal through the respective signal line or element may be computed. In this way, the propagation of a signal, in particular as test signal provided by the measurement device performing the time domain reflectometry measurement may be computed. Accordingly, a faulty position and the related element in the device under test can be easily identified.

The measurement profile for characterizing the device under test may be provided in any appropriate manner. For example, the data may be provided as a file. For example, the data may be provided via a wired or wireless communication link from an external device, for example a remote computer. It may be also possible to provide the measurement profile data by a memory device, for example a removable memory such as a USB stick, secure data (SD) card, saved on the DUT EPROM or the like. Furthermore, it may be also possible that a user may enter the respective data by an input terminal or the like. However, it is understood that any other appropriate manner for providing the measurement profile may be possible, too.

The measurement profile may be determined in advance. For example, the measurement profile may be provided based on measurement data by measuring an error-free device corresponding to the device under test. However, it may be also possible to specify the measurement data based on a data model or the like. In particular, any known or future manner for specifying the measurement profile of the device under test may be possible.

Further to the measurement profile of the device under test, the analysis considers available information of any kind of possible failures of the device under test. For this purpose, device patterns of the device under test may be provided. Each device pattern may be, for example, a failure pattern specifying information of a possible failure of the device under test. Alternatively, the device pattern may be a pass pattern specifying information for characterizing a device without a failure. The device patterns may relate to a time domain reflectometry measurement or at least a characteristic portion of a time domain reflectometry measurement.

In case that a specific failure may occur in multiple different manners, it may be even possible to provide a separate device pattern, in particular separate failure patterns for each manner. For example, if a conductive connection between two elements of the device under test exists, one failure pattern may be provided for a complete interruption of this conductive connection, and one or more further failure patterns may be provided for limited conductive connections. For example, one further failure pattern may be provided for a conductive connection, which provides only 50% of the normal conductive connection, and a further failure pattern may be provided for a conductive connection, which provides only 10% of the normal conductive connection. However, the failure patterns may also relate to any other kind of limited connection or any other kind of failures. Accordingly, when providing multiple failure pattern for a faulty position within the device under test, it may be even possible to specify a degree of a failure, for example a degree of a limited conductive connection. However, it is understood that the specification of failures and the stepwise characterization of faulty positions is not limited only to a degree of a conductive connection. It may be also possible to apply such stepwise characterization of failure positions to other elements, for example damping elements, couplers, mixers etc.

The device patterns may specify, for example, a related element of the device under test. Further to this, the device pattern may provide, for example, data relating to a time domain reflectometry measurement of a device with the related error. Furthermore, any other appropriate information may be also specified by the respective device patterns.

The device patterns may be stored, for example, in an analysis memory of the time domain reflectometry apparatus. This analysis memory may be any kind of appropriate memory. For example, the analysis memory may be a non-volatile memory, a storage device such as a hard disk drive, solid state drive or the like. However, it may be also possible to load the device pattern into a volatile analysis memory.

The device patterns may be obtained, for example, based on empirical measurements of corresponding devices. Alternatively, it may be also possible to obtain the device patterns based on simulations or the like. Pass patterns may also be obtained, for example, based on empirical measurements of corresponding working devices. Alternatively, it may be also possible to obtain the pass patterns based on simulations or the like.

For example, simulations may be performed by any appropriate software tool, e.g. Simulink or any other appropriate software. In particular, it may be possible to use machine learning algorithm for analyzing a configuration of a device under test and determining appropriate device patterns, in particular failure patterns pass patterns. Furthermore, the determination of the device pattern may be performed, for example, based on AI (artificial intelligence) approaches or the like.

For analyzing a device under test, a time domain reflectometry measurement on the device under test is performed. For this purpose, a measurement device is connected to the device under test by a conductive connection, in particular a conductive radio frequency connection. By using a conductive connection, for example a measurement cable or the like between the measurement device and the device under test, antenna effects or the like and in particular reception and transmission of wireless radio frequency signals can be omitted. In particular, the measurement terminal of the measurement device may be connected by the conductive RF connection to a terminal of the device under test, which may receive radio frequency signals. For example, the conductive connection may be connected to a terminal of a RF front end of the device under test.

The measurement device may generate a test signal and provide the test signal via the measurement terminal and the conductive connection to the device under test. Further, the measurement device may measure a response to the test signal, in particular a response caused by reflections in the signal path within the device under test. In particular, failures such as interruption of a signal line, a short circuit or any kind of abnormality may have impact on the test signal and cause a respective reflection of the test signal. Accordingly, the measurement apparatus may receive all the components of the reflections in response to the test signal.

The test signal may be any kind of appropriate signal. For example, the test signal may be a single pulse, which is provided to the device under test. Furthermore, it may be also possible to provide test signals with a frequency sweep, for example, a continuously increasing or decreasing frequency between an upper and a lower frequency range, or a frequency, which increases or decreases in predetermined frequency steps between an upper and a lower frequency range.

The measurement result of the time domain reflectometry measurement may be analyzed by the control device. In particular, the control device may analyze the time domain reflectometry measurement in order to identify one or more failures of the device under test. For this purpose, the control device may receive the measurement result of the time domain reflectometry measurement. For example, the measurement result may be received by a measurement interface. Accordingly, the measurement device and the control device may be communicatively coupled in order to receive the measurement result. For example, the measurement may be received by digital samples corresponding to the time domain reflectometry measurement. The measurement interface of the control device may be coupled with the measurement device, for example, by a bus or any other appropriate communication link.

Furthermore, the control device may receive the above described device patterns. For example, the device patterns may be received by a data interface. Accordingly, the data interface of the control device may be communicatively coupled with the analysis memory providing the device patterns. If the analysis memory is a volatile or non-volatile random-access memory, the control device may be coupled with the analysis memory, for example, by a data bus or the like. Furthermore, any other appropriate data interface may be possible in order to couple the control device with the analysis memory. For example, an appropriate communication link to a hard disk drive or solid-state disk drive may be provided. It may be also possible to obtain the device patterns via a network connection or the like.

The control device further may comprise a processing unit. The processing unit may obtain the above described measurement profile of the device under test. For example, the measurement profile may be received via an appropriate communication link, for example an interface or the like from a further device providing the measurement profile. Furthermore, it may be also possible that the processing unit receives specifications of the device under test and generates the measurement profile based on the received specifications of the device under test. It is understood, that any appropriate manner for obtaining or generating the measurement profile may be possible.

Based on the received measurement data of the time domain reflectometry measurement, the measurement profile and the device patterns, the processing unit may identify one or more failures of the device under test. For example, the processing unit may compare the measurement data of the time domain reflectometry measurement with the device patterns. In case that the time domain reflectometry measurement data correspond to a device pattern, in particular a specific failure pattern, a respective failure may be detected. For this purpose, the processing unit may identify one or more characteristic features considering the time domain reflectometry measurement according to the respective device pattern. In this way, a specific failure or type of failure may be identified, which corresponds to the type of failure of the corresponding device pattern. Furthermore, it may be possible to refer to the measurement profile of the device under test in order to identify a related component or connection in the device under test, which may be affected by the identified failure.

The processing unit may be implemented, for example, by one or more processors performing appropriate software instructions. For this purpose, a program memory may be provided comprising the instructions, which cause the processor of the processing unit to perform the desired operations.

The result of the failure analysis may be provided, for example, to a user. For this purpose, an appropriate message may be output on a display. It may be also possible to provide a schematic representation of the device under test and to indicate the identified one or more failures in this representation. The representation may be provided, for example, on a display such as a computer screen or the like. For example, appropriate software tools such as LabVIEW (National Instruments) or PathWave (Keysight) may be used for describing and/or analyzing a device under test. Accordingly, the results of the measurement may be also provided in a mariner corresponding to representations provided by the respective software tools.

In particular, the representation may a representation in form of a block diagram or the like. However, it may be also possible to provide the identified one or more failures in any appropriate manner. For example, the result may be stored in a memory of the control device. The results may be also provided to a further device, for example a remote computer or cloud service by an appropriate network connection or the like. It is understood, that the measure for outputting the result of the failure analysis is not limited to the above-mentioned possibilities. Any other manner for providing the result of the error analysis may be possible, too.

Further embodiments of the present invention are subject of the further sub-claims and of the following description, referring to the drawings.

In a possible embodiment, the measurement device comprises a vector network analyzer, in particular a network analyzer configured to perform a time domain reflectometry measurement. Vector network analyzers (VNA) usually are well-known in the art. Accordingly, by configuring a vector network analyzer for performing a time domain reflectometry measurement, the system for performing the failure analysis of a device under test according to the apparatus for performing the time domain reflectometry measurement can be easily realized.

In a possible embodiment, the number of device patterns provided by the analysis memory may comprise device patterns based on empirical characterizations of sources of failures.

For example, time domain reflectometry measurements may be performed on faulty devices, which correspond to the type of the device under test. By measuring the faulty devices, in particular by performing a domain reflectometry measurement on the faulty devices and further analyzing the faulty devices in order to determine the failures in the respective devices, it is possible to obtain a comprehensive database of any possible failure. Since the data of the device patterns are obtained empirically by measuring the devices, the obtained device patterns may match the related failures very well. Furthermore, it may be also possible to use one or more device patterns for characterizing a working device without any known failures. Accordingly, the device patterns may comprise one or more pass pattern for characterizing devices without failures. For this purpose, a working device without any failures may be also measured to obtain the respective pass patterns.

In a possible embodiment, the apparatus may further comprise an analyzing unit. The analyzing unit may be configured to receive empirical measurement data of faulty devices. The analyzing unit may be further configured to generate device patterns based on the received empirical measurement data. In particular, the failure patterns may be generated based on the empirical measurement data and a related characterization of the faulty device.

For example, a user may specify one or more specific failures of the faulty device. For this purpose, the user may specify, for example, the identified failures by a user terminal. Further, the measurement device may perform a time domain reflectometry measurement and provide the results of this measurement to the analyzer unit. Accordingly, the analyzing unit may automatically generate an appropriate device pattern based on the specification of the failure and the related time domain reflectometry measurement. The determined device pattern may be stored in the analysis memory. For example, the determined device pattern may be added to the already existing device patterns stored in the analysis memory. However, it is understood, that it may be also possible to determine or generate device patterns by any other appropriate manner, for example based on simulations or the like. Furthermore, appropriate device patterns, in particular failure patterns or pass patterns may be also determined, for example, by machine learning algorithm, artificial intelligence (AI) or based on a neural network.

In a possible embodiment, the control device may be configured to compute a distance between the measurement terminal of the measurement device and a point of failure in the device under test.

The distance may be computed, for example, based on a specific propagation speed of propagation medium in the device under test. The propagation medium and/or the properties of the propagation medium may be obtained, for example, from the measurement profile of the device under test. For example, a propagation speed of a specific propagation medium may be determined, and a length of a specific component may be obtained from the measurement profile. Accordingly, a time may be determined, which is needed by a signal for propagating through the respective component. However, it may be also possible to determine the distance between the measurement terminal and the point of failure by any other appropriate manner. By determining the distance from the measurement terminal to the point of failure, it may be possible to locate the point of failure within the device under test. In this way, the position of a failure can be identified precisely. This allows a user to locate the respective failure and thus, the service time for repairing the device under test can be reduced.

In a possible embodiment, the control device may be configured to modify a signal path in the device under test. In particular, the signal path in the device under test may be modified upon detecting a faulty position in the device under test.

The signal path in the device under test may be modified such that a detected faulty position is omitted. For example, the control device may send one or more commands to the device under test in order to modify the signal path. For example, the signal path in the device under test may be modified by controlling one or more switches or any other appropriate components in the device under test. By adapting/modifying the signal path in the device under test, it is possible to configure a signal path around a detected failure. In this way, it may possible to perform further time domain reflectometry measurements, which allows detecting further failures in the device under test.

In a possible embodiment, the measurement device may comprise a de-embedding functionality. The de-embedding functionality may provide a virtual shifting of an entry point of the device under test. Accordingly, the configuration may be adapted in case that a point of failure is far away from the entry point of the device under test. In this way, it is possible to detect even a point of failure, which is deeper inside the device under test.

In a possible embodiment, the control device may be configured to identify a number of potential failure positions in the device under test. In particular, the number of potential failure positions may be determined based on the measurement profile provided for the device under test. In this case, the control device may further generate at least one measurement task for each identified potential failure position. Further, the control device may successively perform multiple time domain reflectometry measurements according to each of the generated measurement tasks. In this way, a separate measurement may be performed for each potential failure position. Hence, it is possible to verify for each of the potential failure positions, whether or not a fail exists on the respective position.

In a possible embodiment, the processing unit may be configured to determine a degree of damage of an identified failure. In particular, the degree of damage may be determined based on the measurement result of the time domain reflectometry measurement. The degree of measurement may specify, for example, a degree of interruption of a partial interrupted conductive signal line. Furthermore, a degree of damage may also specify a characterization of a faulty damping element, or a specification of isolation properties, for example reduced isolation properties or the like. However, it is understood, that any other specification for indicating a degree of damage in the device under test may be possible, too.

In a possible embodiment, each device pattern may relate to one of a number of failure classes. In this case, the processing unit may be configured to classify the identified failures based on the corresponding device pattern. Thus, a classification of an identified failure can be easily performed. For example, the classification may relate to a degree of a difficulty for repairing the identified failure, a degree of impact with respect to the desired operation of the device under test or any other appropriate classification. In this way, the analyzed devices under test can be easily classified, for example, the analyzed devices under test may be sorted into multiple classes of quality or may be sorted depending on the degree of difficulty for service. For example, it may be determined, whether or not a device under test can be repaired on the field or it may be necessary to send the device under test to a specific service laboratory or the like.

With the present invention it is possible to provide an easy and reliable analysis of failures for complex devices under test, in particular devices with radio frequency components such as a RF front end. For this purpose, time domain reflectometry measurements may be performed on the device under test, and the results of the time domain reflectometry measurements may be compared with known device patterns in order to identify a type of failure and/or a position of failure within the device under test. In this way, a failure time and/or position can be easily identified and thus, a service for repairing a faulty device can be assisted.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which.

Figure 1:
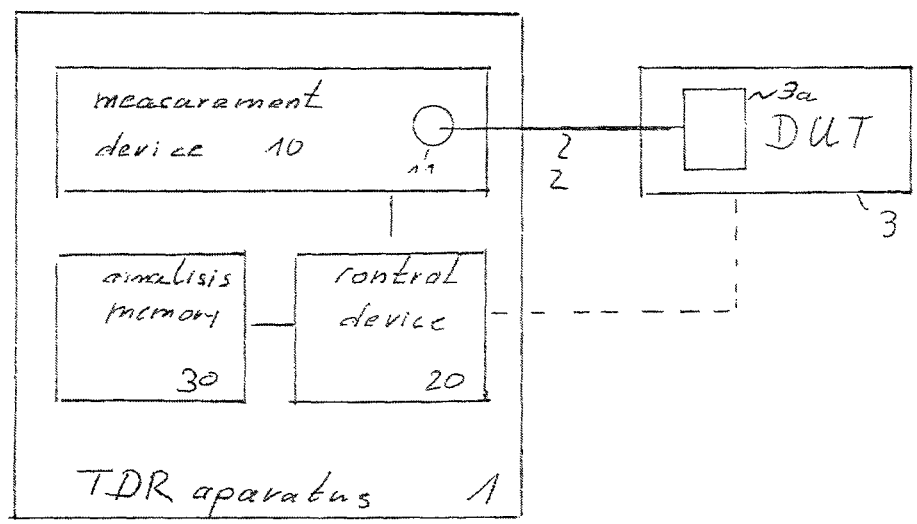
FIG. 1: shows a schematic block diagram of an apparatus for performing time domain reflectometry according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The embodiments in the drawings are not necessarily shown in scale.

In the drawings, same, functionally equivalent and identical operating elements, features and components are provided with same reference signs in each case, unless stated otherwise.

DESCRIPTION of EMBODIMENTS

FIG. 1 shows a schematic block diagram of an apparatus for performing time domain reflectometry according to an embodiment. The apparatus comprises a measurement device 10, a control device 20 and an analysis memory 30. A measurement terminal 11 of the measurement device 10 may be connected via a conductive connection 2 with a device under test 3. For example, the device under test 3 may include a radio frequency front end 3a.

Measurement device 1 may be or comprise a vector network analyzer. In particular, measurement device 10 may perform a time to main reflectometry measurement. For this purpose, measurement device 10 may generate a test signal and provide the generated test signal via the measurement terminal 11 and the conductive connection 2 to an input port of the device under test 3. The test signal may be any kind appropriate signal for performing a time domain reflectometry measurement. For example, the test signal may be a single pulse. For example, measurement device 10 may generate a test signal with a frequency sweep between a lower and an upper frequency. The frequency sweep may be a continuous frequency sweep in the specified frequency range. Alternatively, the frequency sweep may increase or decrease by specific frequency intervals. However, it is understood, that any other appropriate test signal for performing a time domain reflectometry may be possible, too.

The measurement device 10 further receives reflection of the test signal from the device under test 3. Based on the received reflections, it is possible to identify discontinuities and abnormalities in the device under test 3. For example, a failure in the signal path of the device under test 3 may cause a reflection of the test signal, which is different from the reflections provided by an error-free device under test 3. In this way, the reflections of the test signal can be analyzed in order to identify failures in the device under test 3 without the need of opening the device under test 3.

Since it may be difficult to directly analyze the reflections of the test signal measured by measurement device 10, apparatus 1 further comprises control device 20 for analyzing the measurement result of the time domain reflectometry measurement performed by measurement device 10. In the following, the analysis of the measurement result and the detection of failures in the device under test 3 will be described in more detail.

First, a characterization of the measurement device 10 may be provided. For this purpose, a measurement profile may be provided, which comprises specifications of the components included in the device under test 3. For example, the measurement profile may specify the individual elements in the device under test 3 and the connections between the individual elements. For example, the measurement profile may specify components such as filters, splitters, couplers, attenuators, resistors, capacitors, inductors or the like. As it might be not possible to perform a time domain reflectometry measurement through some elements such as mixers, amplifiers, these elements may terminate a measurement path and it might be only possible to evaluate an input section of this components. Further to this, signal lines such as waveguides, wires, cables, connectors or the like may be specified. For example, propagation properties such as propagation speed or length of a signal line may be specified. Accordingly, based on these propagation probabilities, it may be possible to determine a propagation time of a signal through the respective component.

Furthermore, the measurement profile may be used to determine a signal path through the device under test 3. However, it is understood, that any other features or properties of the device under test 3 may be also specified by the measurement profile of the device under test 3.

The measurement profile may be provided, for example, by an appropriate memory device such as an internal memory of apparatus 1, in particular of the control device 10. However, it may be also possible to receive the measurement profile via an appropriate connection, for example a network connection or the like from a remote device, for example a cloud server or the like. The profile may also be created based on profiles of simulation software or development software, e.g. LabView. The profile may also be created on a wizard on the user interface. It is understood, that any other possibility for providing the measurement profile may be possible, too.

Apparatus 1 further comprises an analysis memory 30. Analysis memory 30 may store data relating to known possible failures of a device under test 3. For example, empirical measurement data may be acquired from faulty devices corresponding to the device under test 3. For this purpose, it may be possible to perform time domain reflectometry measurements on a faulty device with a specific, known failure. Thus, measurement data of a time domain reflectometry measurement are obtained comprising characteristic reflections of test signals relating to the respective failure of the faulty device. Accordingly, it may be possible to use the obtained time domain reflectometry measurement as a whole. Alternatively, it may be also possible to isolate a characteristic segment in the measurement data of the time domain reflectometry measurement corresponding to the specific failure of the respective device. The obtained measurement data or at least the isolated segment of the measurement data may be stored in the analysis memory 30 together with additional information such as a characterization of the respective failure. For example, the characterization may comprise a description of the failure, for example "interruption of signal line", "short circuit to ground", "partial interruption of a signal line" or the like. In particular, if a signal line is only partially interrupted, it may be possible to further specify the degree of this partial interruption. Accordingly, if an isolation element is faulty, it may be also possible to specify the degree of the reduced isolation at the respective position. It is understood, that any other kind of characterization of a failure may be possible, too.

Analysis memory 30 may store device patterns for a specific type of a device under test. However, it may be also possible that analysis memory 30 stores device patterns for multiple types of devices under test. In this case, it may be possible to specify a specific type of the device under test, and the failure analysis refers to device patterns according to the specified type of a device under test. The type of the device under test may be specified, for example, manually by a user input. For example, the user may enter a specification or select a type of a list of available types.

As already mentioned above, the device patterns may comprise failure patterns and/or pass patterns. Failure patterns may be used for specifying characteristics of a device under test with one or more known failures. Pass patterns may be used for characterizing a working device without any failure. Accordingly, pass patterns may be used for identifying arrow-free devices.

Furthermore, it may be also possible that the apparatus of one automatically identifies a specific device under test 3. For example, control device 20 may receive an identification information from the connected device under test 3. Based on the received information, control device 20 may search in the analysis memory 34 appropriate device patterns. However, it is understood, that any other manner for identifying a device under test 3 and selecting appropriate device patterns may be possible, too.

In order to evaluate the device under test 3, processing device 20 may receive the measurement data of the time domain reflectometry measurement from measurement device 10 and analyze the received measurement data. In particular, control device 20 may refer to the device patterns stored in analysis memory 30 and compares the received measurement data with the corresponding data in the pass patterns, in particular in the failure patterns and/or pass patterns. If a control device 20 detects a match between the received measurement data of the time domain reflectometry measurement and a device pattern, in particular a failure pattern, a respective failure is identified in the device under test 3. Accordingly, the type of the identified failure may be specified based on the additional information provided by the respective failure pattern. Furthermore, it may be also possible to specify a degree of a failure, for example a reduced isolation or reduced conductive properties of a signal line based on the identified failure pattern.

Furthermore, an element in the device under test 3 which is affected by a failure may be also identified on basis of the data provided by the identified device pattern. Additionally, or alternatively, it may be also possible to determine the position of a failure in the device under test 3 by calculating a propagation time of the signal through the signal path in the device under test 3. For this purpose, the specific characteristics of the individual elements in the signal path of the device under test 3 may be taken into account. For this purpose, the information of the device under test 3 provided by the measurement profile may be taken into account. For example, for each element and each signal line of the device under test 3, the propagation speed of the signal and the length of the respective element may be taken into account and a transmission time of the signal may be computed. In this way, it is possible to identify a distance between a reference point, for example the measurement terminal 11 of measurement device 10 and the faulty position in the device 3.

After a failure of the device under test 3 has been identified, the analysis may be stopped. However, it may be also possible to continue with the analysis in order to identify further failures in the device under test 3. For this purpose, a signal path within the device under test 3 may be changed. In this way, it is possible to configure an alternative/further signal path such that the previously identified position of a failure is excluded from the new signal path. In this way, impacts on the time domain reflectometry measurement caused by the previously identified failure are omitted.

In order to modify the signal path through the device under test 3, a communication link may be established between the control device 10 of apparatus 1 and the device under test 3. For example, a wired communication link may be used for sending configuration commands (for example SCPI commands) from the control device 10 to the device under test 3. However, any other manner for configuring the device under test 3 may be possible, too.

Figure 2:
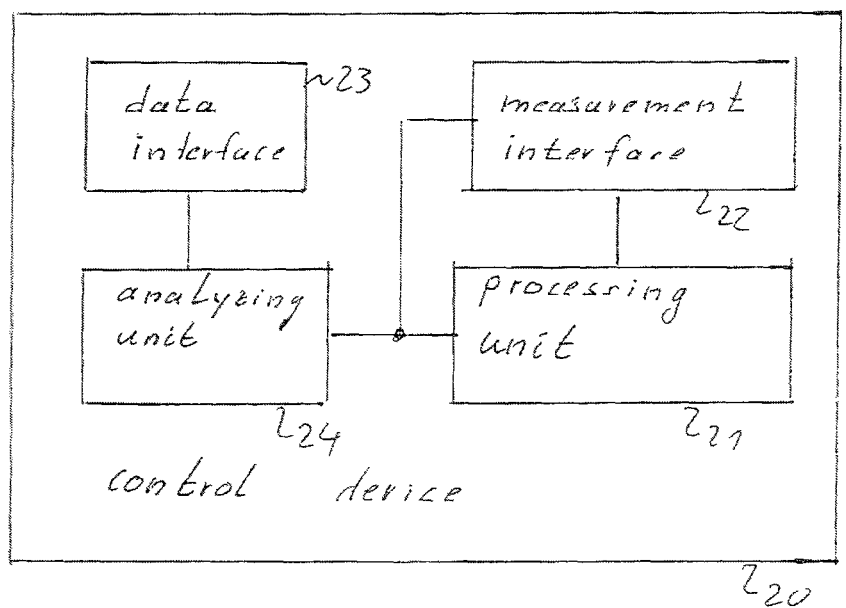
FIG. 2: shows a schematic block diagram of a control device of an apparatus for performing time domain reflectometry according to an embodiment.

FIG. 2 shows the control device 20 of FIG. 1 in more detail. As can be seen in this figure, control device 20 may comprise a processing unit 21, a measurement interface 22 and a data interface 23. Furthermore, control device 20 may comprise an analyzing unit 24.

Measurement interface 22 may be communicatively coupled with measurement device 10. Accordingly, control device 20 may receive measurement data from measurement device 10 via any kind of appropriate communication link, for example a bus or a network connection. Furthermore, the data of analyzing memory 30 may be received by data interface 23. The data from analysis memory 30 may be received via an appropriate bus, network connection or the like. Measurement interface 22 and data interface 23 may provide the received data to processing unit 21, which performs the necessary operations in order to identify one or more failures in device under test 3 based on the measurement data provided by measurement device 10. For this purpose, processing unit 21 may include, for example, one or more processor, which executes appropriate instructions in order to perform the above described operations. The instructions may be stored, for example, in a program memory or the like.

For generating the device patterns, control device 20 may comprise an analyzing unit 24. Analyzing unit 24 may generate one or more device patterns based on empirical measurements on faulty and/or error-free devices, e.g. devices corresponding to the device under test 3. For this purpose, measurement device 10 may perform a time domain reflectometry measurement on a faulty device with a specific, known failure or are-free devices. For example, a number of failure patterns may be determined relating to faulty devices and one or more pass patterns may be determined based on devices without failures.

The measurement results of this time domain reflectometry measurement may be provided to analyzing unit 24. Furthermore, additional information of the specific failure may be also provided to analyzing unit 24. For example, a user may specify the additional information on an input terminal or additional information may be received from a remote device via a network connection or the like. Based on the provided information, analyzing unit 24 may generate an appropriate device pattern. The generated device pattern may be stored, for example, in analysis memory 30. For example, the sequence of the signal received by measurement device 10 may be stored together with the additional information specifying the related failure. However, it may be also possible to extract only a characteristic portion of the received measurement data and store only this portion together with the related additional information. The additional related information may comprise, for example, the type of a failure, the element affected by the failure, a degree of the failure or any other appropriate information. For example, it may be also possible to specify a number of classes and assign at least one of the specified classes to each failure. For example, the individual classes may specify, whether or not a further (limited) operation with the detected failure may be still possible, whether the failure can be repaired in the field or whether the device has to be sent to a specific service station. However, any other kind of classification may be possible, too. Accordingly, this classification may be used for classifying a detected failure in a device under test 3.

Depending on the complexity of the device under test 3, it may be difficult to identify failures, which may be far away from an input terminal of the device under test 3. In some cases, it may be possible to alter the signal path through the device under test 3 in order to measure different portions of the device under test 3. Further to this, it may be possible to modify the measurement by so-called de-embedding functionalities. Such a de-embedding may move a virtual reference plane away from the measurement terminal 11 of the measurement device 10 further into the device under test 3. Accordingly, by such a de-embedding functionality, it may be possible to perform a more appropriate measurement of components, which are further away in the device under test 3. For example, the de-embedding functionality may perform appropriate mathematical operations in order to compensate some of the elements in the device under test 3. Further to this, it may be possible to adapt the signal level of the test signal or the signal characteristics of the test signal accordingly.

By means of de-embedding it is possible to analyses similar devices with different hardware-options, in particular different hardware-options which lead to different a length in one part inside the devices under test. For example, a first device may comprise an input, an attenuation section with the first length and a switch. A second device may comprise a same input and a same switch but an attenuation section with a second length. In such a case, the switches of both devices may be analyzed by a same device pattern of the switch by means of de-embedding. Of course, de-embedding may be also applied for considering similar devices, wherein one or more sections in a signal path may have different length followed by a further same component.

Figure 3:
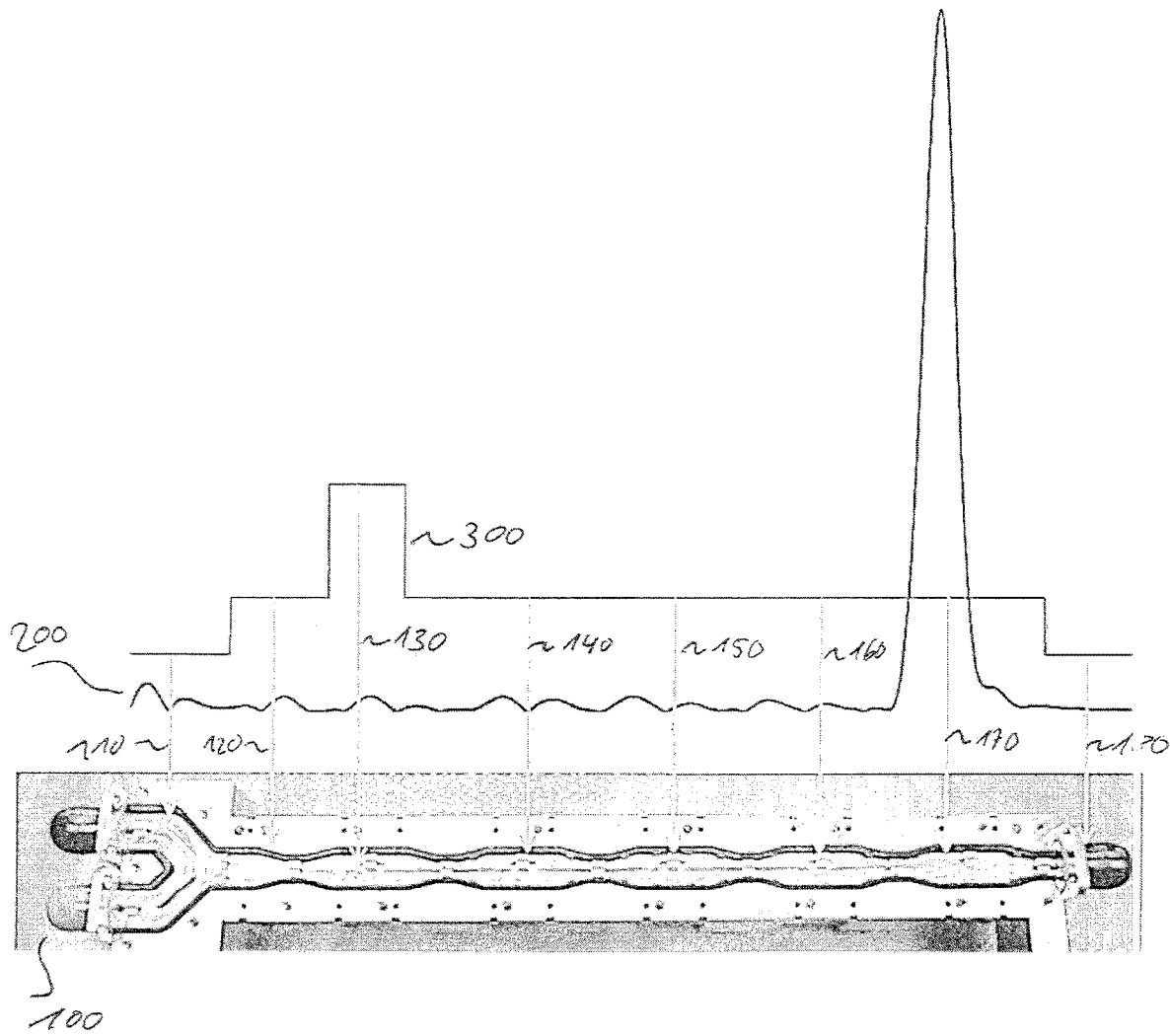
FIG. 3: shows a schematic illustration of a time domain reflectometry measurement provided by a user interface of an apparatus according to an embodiment.

FIG. 3 shows an example of a possible representation indicating a result of a measurement performed by an apparatus 1 as described above. In the bottom part of this illustration, a representation 100 of the device under test is shown. In the example of FIG. 3, the device under test may be divided in eight sections 110 to 180. For example, first section 110 may be an input section, second section 120 may be a switch, for example an input switch, and a third section 130 may be a coupling stage. The following, the device under test may comprise for further sections 130 to 170 and an output section 180.

Further, the representation of the measurement result may be shown by a signal curve 200 illustrating a representation of a time domain reflectometry measurement. In particular, the result of the time domain reflectometry measurement may be illustrated as signal power of the received reflections along the electrical distance, wherein the electrical distance may be illustrated in correlation with the respective sections 110 to 180 of the device under test. In this way, a user can easily recognize a relationship between the measured reflections and the respective portion of the device under test.

Additionally, it may be possible to show limits 300 for the reflections. In particular, a separate limit may be specified for each section 110 to 180 of the device under test. For example, the limits for the reflections in the respective sections 110 to 180 may be specified by the device patterns provided for the respective device under test. For example, a respective section may be considered to be without a failure if the measured reflections in the respective section are below the respective limit 300. If the reflections exceed over the specified limit, a failure may be detected at a respective portion of the signal path in the device under test.

By displaying the signal curve 200 with the result of the time domain reflectometry measurement together with the related sections 110 to 180 of the device under test and the limits 300, a user can easily recognize whether or not a failure exists in the measured device under test. For this purpose, the user only has to compare the signal curve 200 with the indicated limit 300. Further, the user can also easily recognize the position of the failure in the device under test, since the signal curve 200 is illustrated in relationship with the respective sections 110 to 180 of the device under test. In this way, a very fast and easy analysis of the device under test can be performed. Furthermore, a position of a potential failure of the device under test can be easily identified, and thus, the service time, in particular the time for repairing such a failure be reduced. Furthermore, it may be even possible to test a device under test and verify whether or not a device under test is without failure. For example, a device under test may be determined to be without failure, if the signal curve 200 with the measurement results of the time domain reflectometry measurement is below the limit 300 over as a whole measurement distance.

In the example shown in FIG. 3, the value of a reflection may exceed the limit 300 at the position of section 170. Thus, it can be easily recognized that a failure may exist at the position of section 170. Accordingly, a service person may recognize that the measured device under test is faulty. Further, the service person also can easily identify the 40 position in the device and repair the respective section. In order to identify the position of the failure, the propagation time of the measured signal may be analyzed. Based on the propagation speed through each of the known components and signal lines through the device under test 3, it is possible to calculate a distance between the measurement terminal 11 of the measurement device 10 and the position of the detected failure. This length may be used in order to identify the position of the detected failure in the device under test 3. Accordingly, it is even possible to identify a position of the failure within the device under test 3 very precisely. For example, it may be possible to identify an interruption in a signal line, for example a cable or a wire even if the respective connection is hidden or covered by further elements. By specifying the position precisely, a user can easily locate the respective failure.

The above described time domain reflectometry measurement may be performed by any appropriate device, in particular each device, which may generate a test signal and measure the response of the reflected signals from the device under test 3. In particular, the time domain reflectometry measurement may be performed, for example by a vector network analyzer (VNA) with time domain reflectometry measurement capabilities. However, any other appropriate device may be possible (for example, oscilloscopes paired with signal generators), too.

Figure 4:
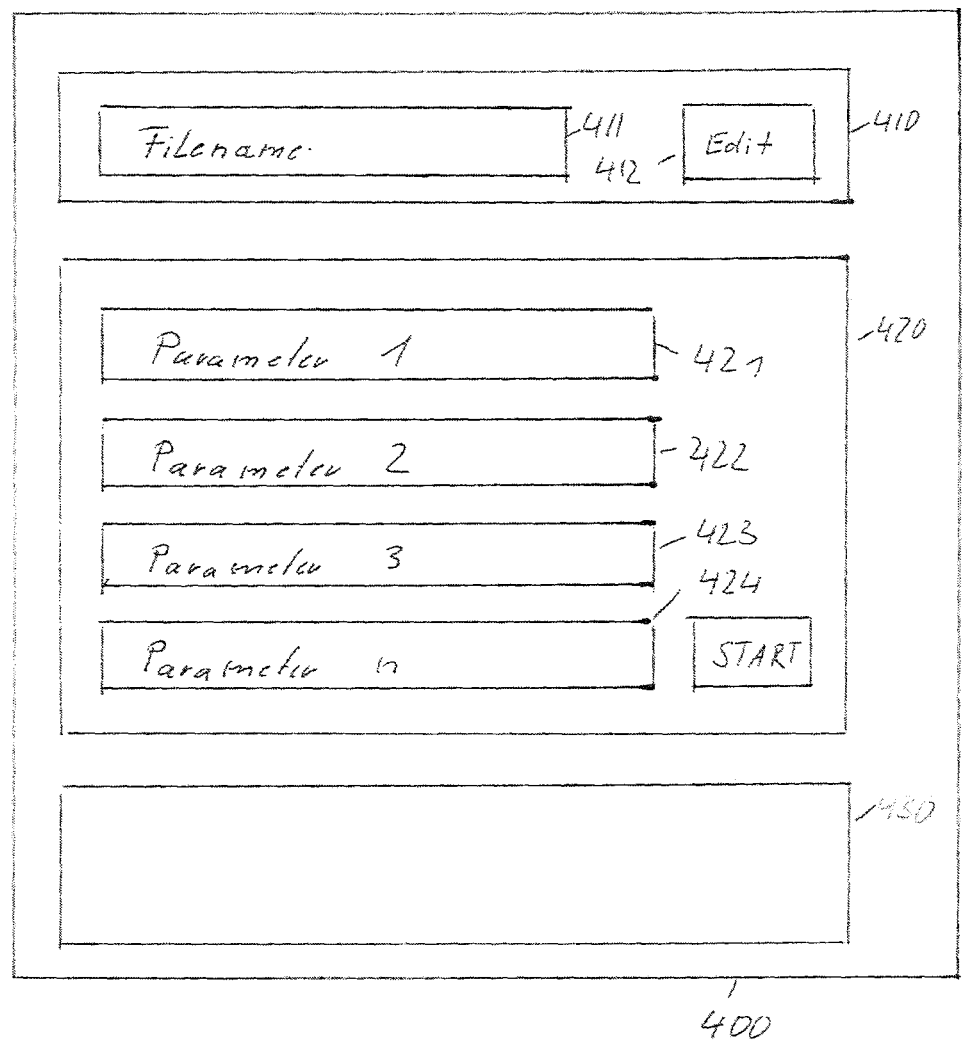
FIG. 4: shows a schematic illustration of an example of user interface for configuring the apparatus for performing time domain reflectometry.

FIG. 4 shows a schematic diagram illustrating an example of a user interface 400 for configuring the apparatus for performing time domain reflectometry measurement. For example, the user interface 400 may be provided on a display screen such as a computer monitor or a display of measurement device 10, for instance display of a vector network analyzer or the like. However, any other kind of display for showing the user interface 400 may be possible, too.

A user may enter or select input data by means of any kind of appropriate input device. For example, the user may use operating elements such as buttons, knobs, or a rotary element of the apparatus, in particular the measurement device 10, for providing input. However, it may be also possible to use an external keyboard, mouse and/or other appropriate input device for entering or selecting appropriate data.

For example, user interface 400 may comprise a first section 410 for specifying the related device under test. For this purpose, it may be possible that a user specifies in section 411 a particular data file comprising relevant information for characterizing the device under test. For example, such a data file may be a data file which has been provided in advance by an appropriate software tool such as, for instance, Simulink or the like. The data file may be stored, for example, in an internal memory, for example a nonvolatile memory such as a hard disk drive or a solid state drive. It may be also possible to provide the related data by a removable storage device such as a USB stick, SD card or the like. Furthermore, the data for characterizing the device under test may be provided by a remote device via an appropriate network connection. For example, the data for specifying the device under test may be stored on a central network server or the data may be provided from another computing device, for example a computing device which has been used for designing and/or specifying the respective parameters of the device under test. However, any other manner for providing an appropriate specification of the device under test may be possible, too.

Additionally or alternatively, it may be also possible that the apparatus for performing the time domain reflectometry measurement may provide the feature of an editor for directly entering the specification of the device under test. For example, the first section 410 of the user interface may comprise an appropriate hardware or software button 412 for starting such an editor. The editor may be used for entering an appropriate model characterizing the individual elements of the device under test. For example, the editor may provide a wizard for specifying a block diagram, e.g. attenuators, filters, mixers, low noise amplifiers, power amplifiers or the like of the device under test. Such a wizard may be, for example, similar to a corresponding editor of other software tools such as Simulink or the like. In this way, a user can easily operate the tool for specifying the device under test.

Furthermore, the user interface 400 may comprise a further section 420 for entering appropriate measurement data, in particular parameters for performing the time domain reflectometry measurement. For example, this section may be used for specifying multiple parameters 421-424 such as a frequency range, for example a start frequency and/or a stop frequency, a number of sweep points of the measurement, a stimulus power, a bandwidth, etc. It is understood, that any other appropriate parameter for specifying the measurement procedure of the time domain reflectometry measurement may be also specified in this further section 420 of the user interface 400.

Additionally, the user interface 400 may comprise another section 430 illustrating a schematic or graphical representation of the test arrangement. For example, section 430 may provide a graphical representation of the test configuration including the individual elements of the device under test according to the specification as received, for example, according to the data entered in the first section 410. In this way, a user can easily recognize and verify an appropriate configuration of the test arrangement.

It is understood, that the user interface 400 may comprise any appropriate additional elements for receiving user input and/or providing the current configuration of the apparatus for performing the time domain reflectometry measurement. For example, the user interface may comprise an element for illustrating the current status of the configuration procedure. Accordingly, during the time domain reflectometry measurement, the user interface may also provide information illustrating the current status of the measurement procedure.

Figure 5:
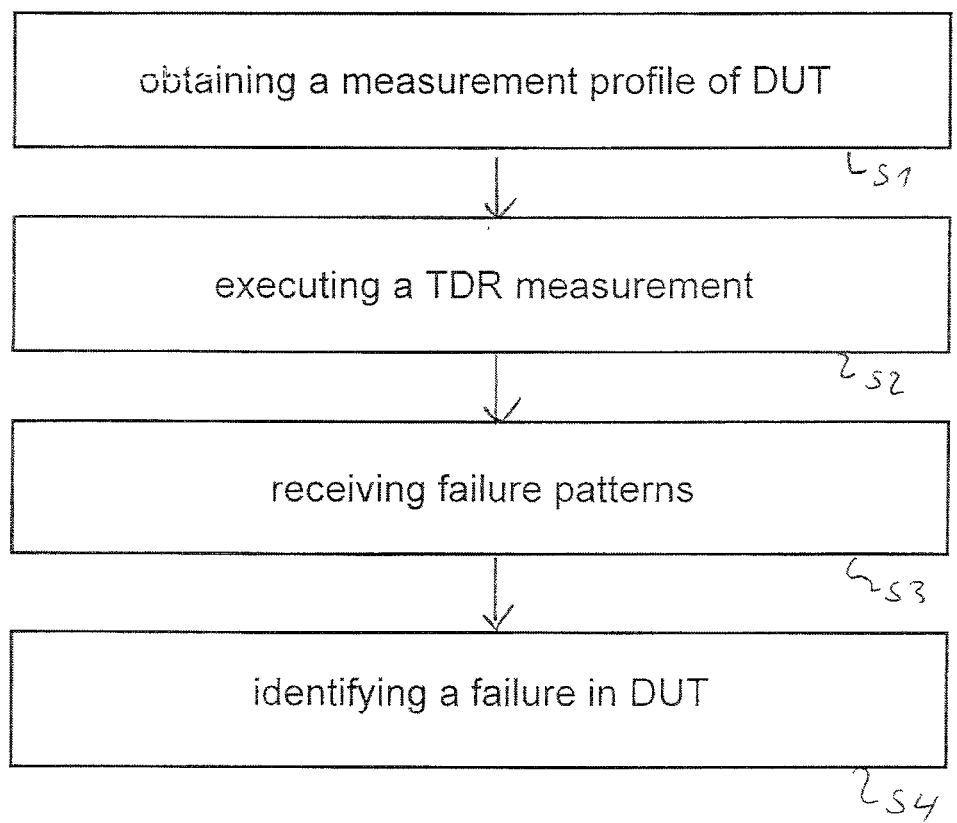
FIG. 5: shows a flow diagram of a method for performing time domain reflectometry according to an embodiment.

FIG. 5 shows a flow diagram illustrating a method for performing time domain reflectometry measurement according to an embodiment. The method may comprise any kind of step, which have been described above in connection with the apparatus 1. Accordingly, apparatus 1 as described above may comprise any appropriate device or element for performing an operation as will be described below in connection with the method.

The method for performing time domain reflectometry may comprise a step S1 for obtaining a measurement profile of the device under test 3. The measurement profile may comprise a specification of components included in the device under test 3. The method further comprises a step S2 of executing a time domain reflectometry measurement on the device under test 3. In particular, the measurement may be performed by a measurement device 10. The measurement device 10 may comprise a measurement terminal 11, and the measurement terminal 11 is connected to the device under test 13 by a conductive radio frequency connection 2. In particular, the device under test 3 may be configured to receive radio frequency signals. For example, device under test 3 may comprise a radio frequency front end 3a. The method further comprises a step S3 for receiving device patterns from analysis memory 30. The device patterns may relate to components of the device under test 3 according to the obtained measurement profile. Further, the method comprises a step S4 of identifying a failure of the device under test 3. The failure may be identified by comparing a measurement result of the time domain reflectometry measurement on the device under test 3 with the received device patterns.

The time domain reflectometry measurement may be performed, for example, by a measurement device 10 such as a vector network analyzer.

The number of failure patterns may comprise device patterns based on empirical characterizations of sources of failures.

In particular, the method may comprise a step of receiving empirical measurement data of faulty devices and/or error free devices and generating device patterns, in particular failure patterns or pass patterns based on the received empirical measurement data and a characterization of the faulty device.

The step of identifying a failure of the device under test 3 may comprise computing a distance between the measurement terminal 11 of the measurement device 10 and a point of failure of the device under test 3. The distance may be computed based on a specific propagation speed of a propagation medium in the device under test 3.

The method may further comprise a step of modifying a signal path in the device under test 3 upon detecting a failure position in the device under test 3.

The method may further comprise a step of activating a de-embedding functionality of the measurement device 3. The de-embedding functionality may virtually shift an entry point of the device under test 3.

The step S4 of identifying a failure of the device under test 3 may further comprise identifying a number 3 of potential failure positions in the device under test 3 based on the measurement profile of the device under test, a step of generating at least one measurement task for each identified potential failure position, and a step of successively performing multiple time domain reflectometry measurements according to the generated measurement tasks.

The step S4 of identifying a failure of the device under test may further comprise determining a degree of damage of the identified failure based on the measurement result of the time domain reflectometry measurement.

The device patterns may relate to a number of failure classes. Accordingly, the step of identifying a failure of the device under test 3 may comprise classifying an identified failure based on the corresponding failure pattern.

Summarizing, the present invention relates to a time domain reflectometry measurement for an improved failure analysis of a device under test, for example a complex RF front-end. Measurement data of a time domain reflectometry measurement are analyzed with respect to previously acquired empirical measurement data of faulty devices with known failures and measurement data of non-faulty devices. In this way, failures can be identified in the device under test without the need of opening the device.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 apparatus for executing TDR
2 conductive collection
3 device under test
3a RF font end
10 measurement device
11 measurement terminal
20 control device
21 processing unit
22 measurement interface
23 data interface
24 analyzing unit
30 analysis memory
100 representation of DUT
110-180 DUT sections
200 signal curve of measurement
300 limits
400 User interface
410 DUT section
411 file name specification
412 editor button
420 parameter section
421-424 parameter fields
430 Representation of configuration
S1 . . . S4 method steps

The invention claimed is:

1. An apparatus for performing time domain reflectometry, the apparatus comprising:
   a measurement device for executing a time domain reflectometry measurement on a device under test, wherein a measurement terminal of the measurement device is connected to the device under test by a conductive radio frequency connection, and wherein the device under test is configured to receive radio frequency signals;
   an analysis memory for providing a number of device patterns of the device under test; and
   a control device, comprising:
      a processing unit for obtaining a measurement profile of the device under test, the measurement profile comprising a specification of components included in the device under test,
      a data interface for obtaining the device patterns from the analysis memory, wherein the data interface obtains device patterns relating to components of the device under test according to the obtained measurement profile,
      a measurement interface for receiving a measurement result of a time domain reflectometry measurement from the measurement device,
      wherein the processing unit is configured to identify a position of failure within the device under test by comparing the received measurement result with the obtained device patterns relating to components of the device under test.

2. The apparatus of claim 1, wherein the measurement device comprises a vector network analyzer.

3. The apparatus of claim 1, wherein the number of device patterns comprise at least one of failure patterns and pass patterns based on empirical characterizations of sources of failures.

4. The apparatus of claim 1, comprising an analyzing unit for receiving empirical measurement data of at least one of faulty devices and devices without a failure and generating device patterns based on the received empirical measurement data and a characterization of the respective device.

5. The apparatus of claim 1, wherein the control device is configured to compute a distance between the measurement terminal of the measurement device and a point of failure in the device under test based on a specific propagation speed of a propagation medium in the device under test.

6. The apparatus of claim 1, wherein the control device is configured to modify a signal path in the device under test upon detecting a faulty position in the device under test.

7. The apparatus of claim 1, wherein the measurement device comprises a de-embedding functionality for virtually shifting an entry port of the device under test.

8. The apparatus of claim 1, wherein the control device is configured to identify a number of potential failure positions in the device under test based on the measurement profile of the device under test,
generate at least one measurement task for each identified potential failure position, and
successively perform multiple time domain reflectometry measurements according to the generated measurement tasks.

9. The apparatus of claim 1, wherein the processing unit is configured to determine a degree of damage of an identified failure based on the measurement result of the time domain reflectometry measurement.

10. The apparatus of claim 1, wherein the device patterns relates to one of a number of failure classes, and
the processing unit is configured to classify an identified failure based on a corresponding device pattern.

11. A method for performing time domain reflectometry, the method comprising:
obtaining a measurement profile of the device under test, the measurement profile comprising a specification of components included in the device under test,
executing a time domain reflectometry measurement on the device under test by a measurement device, wherein a measurement terminal of the measurement device is connected to the device under test by a conductive radio frequency connection, and wherein the device under test is configured to receive radio frequency signals;
receiving device patterns from the analysis memory, wherein the device patterns relate to components of the device under test according to the obtained measurement profile;
identifying a position of failure within the device under test by comparing a measurement result of the time domain reflectometry measurement on a device under test with the received device patterns relating to components of the device under test.

12. The method of claim 11, wherein the time domain reflectometry measurement is performed by a vector network analyzer.

13. The method of claim 11, wherein the number of device patterns comprise at least one of failure patterns and pass patterns based on empirical characterizations of sources of failures.

14. The method of claim 11, comprising receiving empirical measurement data of at least one of faulty devices and devices without a failure, and
generating device patterns based on the received empirical measurement data and a characterization of the respective faulty device or a device without a failure.

15. The method of claim 11, wherein identifying a failure of the device under test comprises computing a distance between the measurement terminal of the measurement device and a point of failure in the device under test based on a specific propagation speed of propagation medium in the device under test.

16. The method of claim 11, comprising modifying a signal path in the device under test upon detecting a faulty position in the device under test.

17. The method of claim 11, comprising activating a de-embedding functionality of the measurement device for virtually shifting an entry port of the device under test.

18. The method of claim 11, wherein identifying a failure of the device under test comprises:
identifying a number of potential failure positions in the device under test based on the measurement profile of the device under test,
generating at least one measurement task for each identified potential failure position, and
successively performing multiple s-time domain reflectometry measurements according to the generated measurement tasks.

19. The method of claim 11, wherein identifying a failure of the device under test comprises determining a degree of damage of an identified failure based on the measurement result of the time domain reflectometry measurement.

20. The method of claim 11, wherein each device pattern relates to one of a number of failure classes, and
wherein identifying a failure of the device under test comprises classifying an identified failure based on a corresponding device pattern.

* * * * *